United States Patent [19]

Shekhawat et al.

[11] Patent Number: 4,725,741
[45] Date of Patent: Feb. 16, 1988

[54] DRIVE CIRCUIT FOR FAST SWITCHING OF DARLINGTON-CONNECTED TRANSISTORS

[75] Inventors: Sampat S. Shekhawat; P. John Dhyanchand, both of Rockford, Ill.

[73] Assignee: Sundstrand Corporation, Rockford, Ill.

[21] Appl. No.: 861,858

[22] Filed: May 12, 1986

Related U.S. Application Data

[63] Continuation-in-part of Ser. No. 797,625, Nov. 13, 1985, abandoned.

[51] Int. Cl.[4] .......................... H03K 3/26; H03K 3/33
[52] U.S. Cl. .................................. 307/315; 307/270; 307/254; 307/300
[58] Field of Search ............... 307/300, 289, 315, 254, 307/270

[56] References Cited

U.S. PATENT DOCUMENTS

| | | |
|---|---|---|
| 3,697,783 | 10/1972 | Seager . |
| 3,971,961 | 7/1976 | Inami et al. . |
| 4,132,906 | 1/1979 | Allen .................................. 307/300 |
| 4,210,826 | 7/1980 | Baker . |
| 4,234,805 | 11/1980 | Carlsen, II . |
| 4,239,988 | 12/1980 | Akamatsu . |
| 4,312,029 | 1/1982 | Zellmer .............................. 307/300 |
| 4,318,011 | 3/1982 | Zeis .................................... 307/359 |
| 4,404,478 | 9/1983 | Rischmüller ...................... 307/315 |
| 4,410,810 | 10/1983 | Christen . |
| 4,616,144 | 10/1986 | Hideshima et al. ............... 307/315 |

Primary Examiner—Stanley D. Miller
Assistant Examiner—B. P. Davis
Attorney, Agent, or Firm—Wood, Dalton, Phillips, Mason & Rowe

[57] ABSTRACT

Prior circuits for rapidly switching Darlington-connected transistors between on and off states have accomplished relatively fast switching by applying reverse base drive to the transistors to quickly sweep the excess carriers therefrom. However, such circuits have not accomplished the required degree of reduction of turn off time and have induced localized "hot spots" in the base-collector junctions of the transistors. In order to overcome these problems, a drive circuit according to the present invention includes first and second power sources of first and second polarities, a turn-on network coupled between the first power source and the control electrode of a driver transistor of a Darlington-connected pair for selectively turning on the transistor pair, turn-off capacitors coupled between the turn-on network and the control electrodes of each of the transistors and a turn-off network coupled between the capacitors and the second power source for coupling the second power source to the capacitors to rapidly turn off the transistors. Means are included for providing a dwell interval between operation of the turn-on network and operation of the turn-off network to allow recombination of excess carriers in the transistors to minimize the incidence of localized hot spots.

25 Claims, 6 Drawing Figures

FIG. 6 ated in a pulse mode of ope# DRIVE CIRCUIT FOR FAST SWITCHING OF DARLINGTON-CONNECTED TRANSISTORS

CROSS-REFERENCE TO RELATED APPLICATION

This is a continuation-in-part of Shekhawat et al, Ser. No. 797,625, filed Nov. 13, 1985, entitled "Drive Circuit for Fast Switching of Darlington-Connected Transistors", and assigned to the assignee of the instant application, now abandoned.

TECHNICAL FIELD

The present invention relates generally to switching circuits, and more particularly to a drive circuit for rapidly switching transistors connected in a Darlington configuration.

BACKGROUND ART

There are numerous applications in which it is necessary to rapidly turn on and off high-current-capacity power switches to control the power delivered to a load. For example, in an inverter operated in a pulse width modulated (PWM) mode of operation, it may be necessary to cycle power switches carrying a high magnitude of current at a 30 kilohertz switching frequency. Typically, these power switches comprise Darlington-connected bipolar power transistors. At present, the specified storage time of these transistors is on the order of 5 to 7 microseconds. This storage time adversely affects the maximum switching frequency for these transistors and may render them unsuitable for certain applications.

Prior attempts at reducing the turn-off time of Darlington power switches have relied upon the application of a reverse bias to the base-emitter junction of one or both transistors at the time of turn-off to rapidly deplete excess carriers therein. For example, Seager U.S. Pat. No. 3,697,783 discloses transistor switching circuitry that includes a first gating circuit coupled to the base of an input transistor and a second gating circuit coupled to the base of an output transistor. The output transistor is driven on in response to a gating signal by the input transistor and the second gating circuit. During the time the transistors are on, a voltage is built up on a capacitor coupled between the second gating circuit and the base of the output transistor. When the gating signal changes state, a switch is closed to couple the capacitor between the base and emitter electrodes of the output transistor to deplete the number of excess carriers therein so that turn-off can occur in rapid fashion.

Other types of circuits for decreasing the turn-off time of a power switch are disclosed in Akamatsu U.S. Pat. No. 4,389,988, Inami et al U.S. Pat. No. 3,971,961, Carlsen II U.S. Pat. No. 4,234,805 and Baker U.S. Pat. No. 4,210,826 (see FIG. 7 and column 14, line 51 through column 15, line 53).

Prior types of circuits for decreasing the turn-off time of power switches have serious limitations. In the case of circuits like Seager, discussed above, localized "hot spots" or secondary breakdown effects can arise in the base-collector junctions of the transistors due to the rapid depletion of excess carriers. These "hot spots" not only reduce the efficiency of the transistor but also increase the chances of failure thereof. Also, these prior circuits have not achieved the required switching speeds and have not reduced switching losses to an acceptable degree.

DISCLOSURE OF INVENTION

In accordance with the present invention, a drive circuit for use with Darlington-connected transistors accomplishes rapid and efficient switching of such transistors while minimizing the occurrence of "hot spots".

More particularly, the drive circuit of the present invention accomplishes rapid switching of driver and driven transistors connected together in a Darlington configuration. The circuit includes a first power source which develops voltage of a first polarity, a turn-on gating network coupled to the base electrode of the driver transistor for selectively applying the first polarity voltage to first and second turn-off capacitors coupled between the turn-on gating network and the base of the driver and driven transistors, respectively, a second power source that develops voltage of a second polarity opposite the first polarity and a turn-off gating network for selectively coupling the second power source to the turn-off capacitors. During the time the first power source is coupled to the turn-off capacitors, the transistors are turned on and a charge is stored by the capacitors. When the second power source is coupled to the capacitors, an augmented voltage of the second polarity greater than the voltage developed by the second power source is applied to the base of the driver and driven transistors to rapidly turn off same.

In the preferred embodiment, the first polarity and the second polarity voltage are alternately applied to the transistors to switch the transistors between conducting and nonconducting states. Means may be included for providing a dwell interval between application of the first polarity voltage and application of the second polarity voltage to the transistors during which neither voltage is applied thereto. During this dwell interval, recombination of excess carriers in the transistors occurs so that the incidence of localized "hot spots" in the base-collector junction of the transistors is reduced when the second polarity voltage is subsequently applied to the transistors.

In one embodiment of the invention, means are provided between the capacitor and the emitter of the driver transistor for preventing current flow in a direction which causes the driver transistor to operate in a reverse conduction mode. This feature in turn minimizes the possibility of short circuiting of the driven transistor. This possibility is further minimized through the use of means for operating the driver transistor at or slightly below the edge of saturation when such transistor is on.

The drive circuit of the present invention is capable of reducing the turn-off tire of Darlington-connected bipolar transistors to less than three microseconds so that such transistors can be used in high power, high switching frequency applications.

BEST MODE FOR CARRYING OUT THE INVENTION

Figure 1:
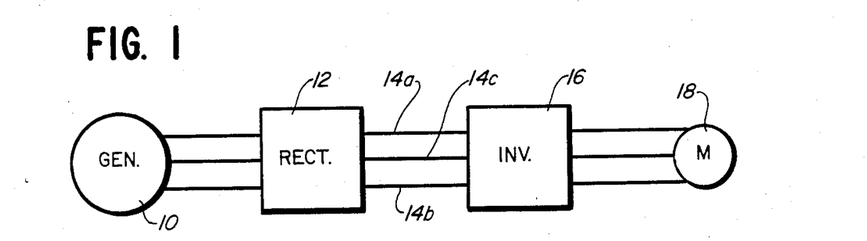
FIG. 1 is a block diagram illustrating a motor drive circuit with which the present invention may be used.

Referring now to FIG. 1, there is illustrated a motor drive circuit with which the present invention may be used. The motor drive circuit comprises a generator 10 which is driven by a variable speed source of motive power (not shown). The generator 10 develops polyphase AC power which is coupled to a rectifier circuit 12 that converts the AC power into positive, negative and ground voltages on DC power buses 14a,14b,14c, respectively. The power buses 14 are in turn coupled to an inverter 16 which converts the DC power into constant or variable frequency palyphase AC power which is delivered to a motor 18.

It should be noted that the motor drive circuit shown in FIG. 1 is exemplary only, in the sense that the present invention may be used with other types of circuits requiring high power and fast switching capability.

Figure 2:
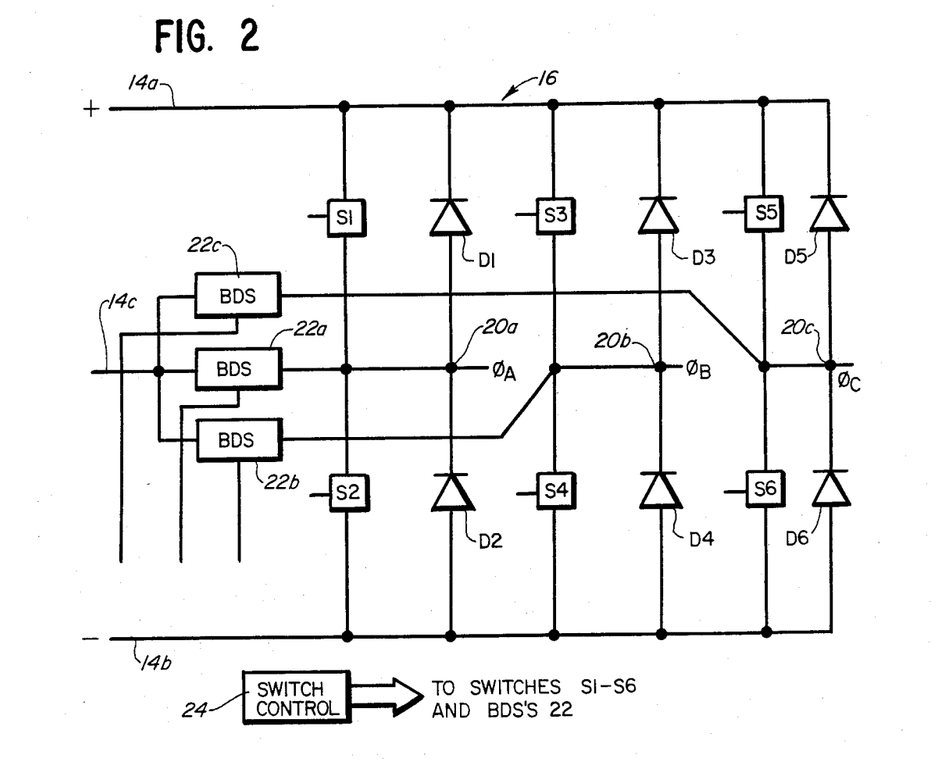
FIG. 2 is a combined block and schematic diagram of the inverter shown in FIG. 1.

Referring now to FIG. 2, the inverter 16 includes first through sixth power switches S1–S6 which are coupled in a three phase bridge configuration. Anti-parallel diodes D1–D6 are coupled across the switches S1–S6, as is conventional.

The inverter 16 shown in FIG. 2 is intended for use as a neutral-clamped pulse width modulated (PWM) inverter in which the maximum output voltage swing developed at phase outputs 20a,20b,20c is limited to one-half the voltage across the DC power buses 14a, 14b. Such an inverter is disclosed in Glennon U.S. patent application Ser. No. 531,037, filed Sept. 12, 1983, entitled "Neutrally Clamped PWM Inverter" assigned to the assignee of the instant application and the disclosure of which is hereby incorporated by reference.

It should be noted that the instant invention may be used in other switching circuits, such as choppers, circuits using proportional base drive circuits or any other circuits using transistors connected in a Darlington configuration.

The inverter 16 shown in FIG. 2 includes three bidirectional switches 22a,22b,22c which are coupled between the phase outputs 20a-20c, respectively, and the power bus 14a. The switches S1–S6 and the bi-directional switches 22 are in turn operated by a switch control 24 to cause generation of the appropriate AC waveform for operating the motor 18.

Figure 3:
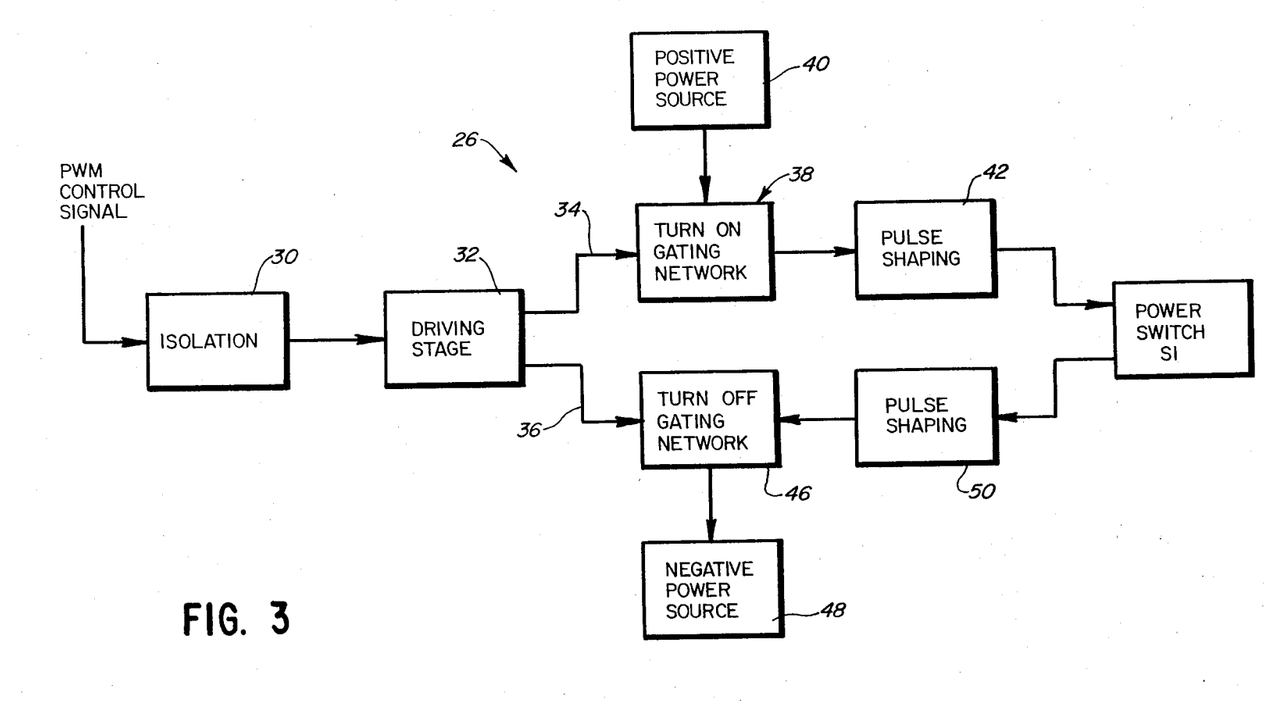
FIG. 3 is a block diagram of circuitry for operating one of the switches S1-S6 shown in FIG. 2.

Referring now to FIG. 3, there is illustrated a portion of the switch control 24 shown in block diagram form in FIG. 2. The circuitry shown in FIG. 3 comprises a drive circuit 26 for operating the power switch S1. It should be noted that duplicate circuitry is provided in the switch control 24 to operate the switches S2–S6 and, if desired, the switches 22.

The circuitry shown in FIG. 3 receives a PWM control signal which is developed by a conventional PWM amplifier (not shown). The PWM control signal is isolated by an isolation circuit 30 and is coupled to a driving stage 32 that develops a gating signal on a pair of lines 34,36 from the isolated PWM control signal. The line 34 is in turn coupled to a turn-on gating network 38 which is coupled to a first power source 40. The first power source develops voltage of a first or positive polarity which is selectively coupled by the turn-on network 38 via a pulse shaping circuit 42 to the power switch S1 so that forward base drive is applied thereto. This selective application of power to the power switch S1 turns the switch on to couple the DC voltage on the power bus 14a, FIG. 2, to the phase output 20a.

The line 36 from the driving stage 32 is coupled to a turn-off gating network 46 which is separate from the turn-on gating network 38,48. The turn-off network 46 is in turn coupled to a second power source which develops voltage of a second polarity opposite the first polarity. This second polarity voltage is selectively applied by the turn-off network 46 via pulse shaping circuitry 50 to the power switch S1 so that reverse base drive is applied thereto to turn same off.

It should be noted that the first and second power sources 40,48 may in fact comprise the outputs of the rectifier circuit 12 on the buses 14a,14b, or may comprise a rectified output of a permanent magnet generator or other power source, as desired.

Figure 4:
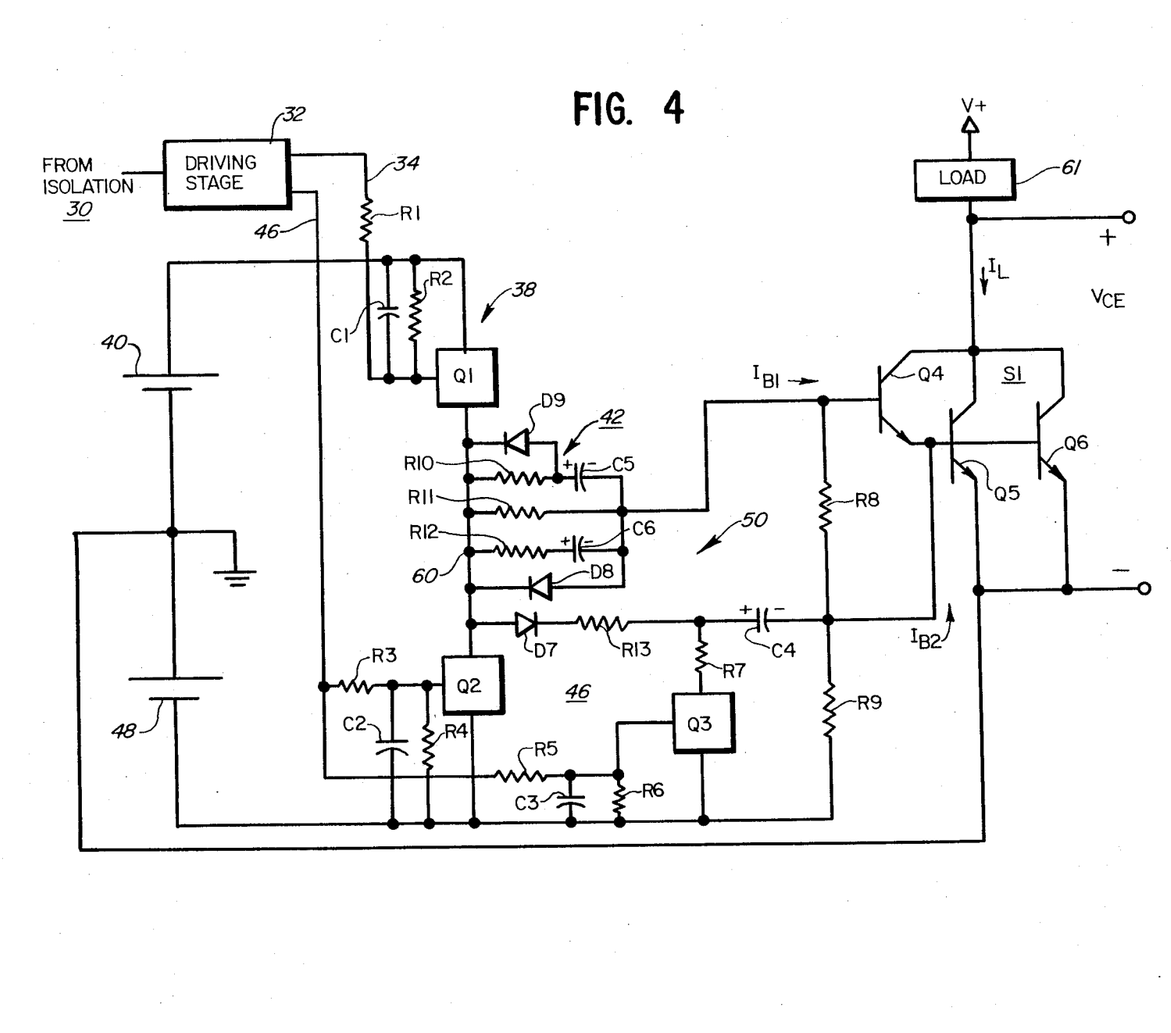
FIG. 4 is a more specific combined schematic and block diagram of a portion of the circuitry shown in FIG. 3.

Referring now to FIG. 4, there is illustrated in greater detail the turn-on and turn-off gating networks 38,46, the pulse shaping circuits 42,50 and the power switch S1.

The gating signal from the driving stage 32 comprises complementary signals, i.e. the signal on the line 34 is high when the signal on the line 46 is low, and vice versa. If desired, the two lines may be replaced by a single line with an inverter coupled thereto to provide the complementary outputs. In either case, a high state signal on the line 34 (and hence a low state signal on the line 46) eventually results in the switch S1 being in the on state while the reverse condition, i.e. a high state signal on the line 46 and a low state signal on the line 34, eventually results in the switch S1 being in the off state.

The line 34 is coupled through a resistor R1 to the control electrode of a switch Q1 which is a part of the turn-on gating network 38. The control electrode of the switch Q1 is also coupled by a capacitor C1 and a resistor R2 to the positive power supply 40.

Main current electrodes of the switch Q1 are coupled between the positive power source 40 and a main current electrode of a first turn-off switch or transistor Q2 which is a part of the turn-off gating network 46. A junction 60 between the switches Q1 and Q2 is coupled through the pulse shaping circuitry 42 to the control or base electrode of a driver transistor Q4 which comprises a part of the switch S1. The junction 60 is also coupled through the pulse shaping circuitry 50 to the control or base electrode of a second transistor Q5 which is also part of the switch S1.

The switch S1 further includes a third transistor Q6 which is coupled in parallel with the transistor Q5 and which together comprise a driven transistor of the switch S1. The two transistors Q5 and Q6 may be replaced by a single driven transistor, if desired.

The control or base electrodes of the transistors Q5 and Q6 are coupled to one of the main current electrodes (i.e. the emitter electrode) of the driver transistor Q4 while the collector main current electrodes of the transistors Q4–Q6 are coupled together to one end of a load 61. The other end of the load 61 is coupled to a voltage V+.

The turn-off gating network 46 includes, as previously noted, the first turn-off transistor Q2 which is coupled to the line 46 by a resistor R3. A delay capacitor C2 and resistor R4 are coupled between the control electrode of the switch Q2 and the second or negative power source 48.

The line 46 is also coupled by a resistor R5 to the control electrode of a second turn-off switch or transistor Q3. A delay capacitor C3 and a resistor R6 are coupled between the control electrode of the switch Q3 and the second or negative power source 48.

It should be noted that, in the preferred embodiment, the switches Q1–Q3 comprise power FET's, although they may be other types of power switches, if desired.

The switch Q3 is coupled to the bases of the transistors Q5 and Q6 through a first turn-off capacitor C4 and a resistor R7. A voltage divider consisting of resistors R8 and R9 is coupled between the base of the transistor Q4 and ground potential. The junction between the resistors R8 and R9 is coupled to the base of the transistor Q5. These resistors bias the transistors Q4 and Q5 for proper operation of same.

Figure 5:
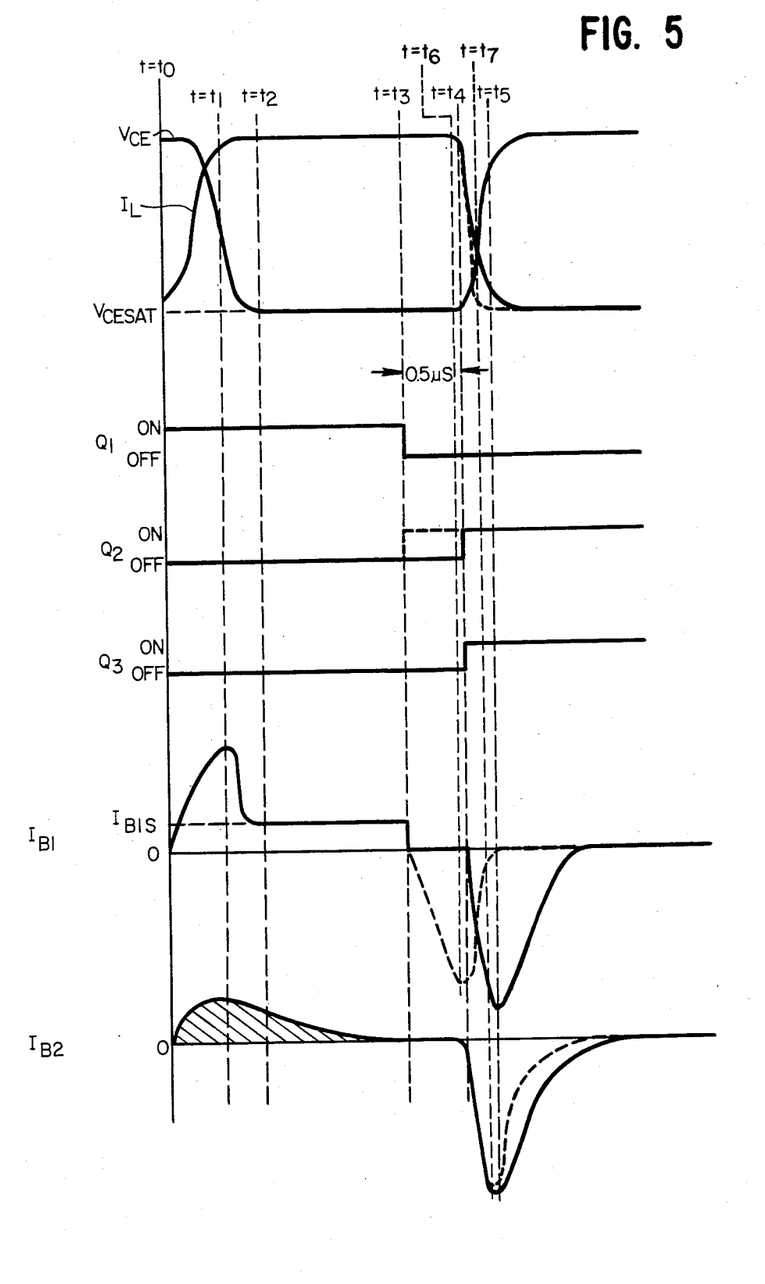
FIG. 5 is a set of waveform diagram illustrating the operation of the circuitry shown in FIGS. 4 and 6.

The operation of the circuitry illustrated in FIG. 4 will now be described with reference to the solid line waveforms of FIG. 5. Assume that immediately prior to time $t=t_0$, the switch S1 is off thereby resulting in a relatively high voltage $V_{CE}$ across the switch S1 and a very low magnitude (i.e. microamperes) of load current $I_L$. At time $t=t_0$, the driving stage 32 develops a high state output on the line 34 and a low state output on the line 46. The switch Q1 is thereby turned on, in turn coupling the positive voltage from the first power source 40 to the base of the transistor Q4 through components in the pulse shaping circuit 42 comprising resistors R10–R12 and second and third turn-off capacitors C5 and C6. The resulting forward base drive current $I_{B1}$ into the base of the transistor Q4 rises very quickly following the time $t_0$ and reaches a peak at a time $t=t_1$. Moreover, forward base drive current is supplied through a diode D7, a resistor R13 and a capacitor C4 to the base of the transistor Q5. This current, designated $I_{B2}$, also rises very quickly following the time $t=t_0$ and reaches a peak at or near the time $t=t_1$. The base currents $I_{B1}$ and $I_{B2}$ rapidly turn on the transistors Q4–Q6, in turn lowering the voltage $V_{CE}$ to a saturated value $V_{CESAT}$ and allowing the load current $I_L$ to rise to a high value.

Following the time $t=t_1$, the current $I_{B1}$ decays in exponential fashion. The current $I_{B1}$ reaches a steady state value $I_{B1S}$ at a time $t=t_2$, which steady state value is determined by the resistance of the resistor R11. At this point, the capacitors C5 and C6 are charged to a high voltage with polarity as indicated in the figure.

Also in the time period following the time $t=t_1$, the current $I_{B2}$ through the capacitor C4 eventually drops to a zero level. The current $I_{B2}$ decays at a substantially slower rate than the current $I_{B2}$ due to the relative values of the components R10, R12, R13, C4, C5 and C6. Once the current $I_{B2}$ has dropped to zero, the voltage across the capacitor C4 reaches a high value, typically within a couple of volts of the voltage provided by the first power source 40.

At time $t=t_3$, the gating signal from the driving stage 32 reverses state, i.e. a high state signal is developed on the line 46 while a low state signal is developed on the line 34. This reversal of states of the gating signal substantially immediately turns off the transistor Q1. However, the transistors Q2 and Q3 are not turned on until a dwell interval or delay period has elapsed following the time $t=t_3$. This dwell interval or delay period is provided by means including the resistors R3–R6 and the capacitors C2 and C3 coupled to the control electrodes of the transistors Q2 and Q3 which together delay the application of the second polarity voltage to the transistors Q4–Q6. In the preferred embodiment of FIG. 4, the dwell interval is one-half microsecond in duration, although it may be made longer or shorter, depending upon the characteristics of the transistors of the switch S1.

The purpose of this dwell interval, during which none of the transistors Q1–Q3 is on and therefore no base drive is applied to the transistors Q4–Q6, is to allow recombination of excess carriers in the transistors Q4–Q6 prior to the application of reverse case drive thereto. This recombination period reduces the number of excess carriers in the base-collector junctions of the transistors Q4–Q6 so that, when reverse base drive is applied thereto to quickly turn off same, the incidence of localized hot spots is substantially reduced. This in turn increases the efficiency of the devices and reduces the chance of failure thereof.

At the end of the dwell interval at time $t=t_4$, the transistors Q2 and Q3 turn on, in turn applying reverse base drive to the transistors Q4–Q6. More specifically, when the transistor Q2 turns on, the base current $I_{B1}$ increases exponentially in a negative direction through the transistor Q2 to the second power source 48. Also, the voltage drop across the transistor Q3 decreases to a low level, effectively coupling substantially all of the voltage across the capacitor C4 and the voltage developed by the second power source 48 in a reverse direction across the base-emitter junction of the transistors Q5 and Q6. The capacitor C4 therefore comprises means for providing an augmented voltage of the second polarity greater than the voltage developed by the second power source 48 to the base-emitter junctions of the transistors Q5 and Q6 to quickly turn off same.

A similar result is accomplished in terms of the transistor Q4 by operation of the transistor Q2. That is, turn on of the transistor Q2 causes the capacitors C5 and C6 to provide an augmented voltage of the second polarity to the base-emitter junction of the transistor Q4 to rapidly turn off this transistor.

Subsequent to the time $t=t_4$, the load current $I_L$ decreases rapidly and the voltage $V_{CE}$ across the transistors Q4–Q6 rises. The base currents $I_{B1}$ and $I_{B2}$ reach maximum reverse values at or around a time $t=t_5$ and thereafter decay to substantially a zero level as the excess carriers are swept out of the bases of these transistors.

The circuitry shown in FIG. 4 is especially useful to quickly turn off the transistors Q4–Q6. However, it has been found that, under a certain operating condition (particularly when the resistor R13 is small), the transistor Q4 could operate in the reverse conduction mode. This was found to occur when a relatively low magnitude of load current $I_L$ was conducted by the transistors Q5 and Q6. In this case, the base current $I_{B2}$ supplied through the capacitor C4 caused reverse current flow through the emitter and collector electrodes of the transistor Q4. This operation could, in turn, cause short circuiting of the ransistors Q5 and Q6.

Specifically, it can be seen that:

$$V_{CEQ5\ or\ Q6} = V_{CEQ4} + V_{BEQ5\ or\ Q6}$$

When the transistors Q5 and Q6 are fully saturated, the value $V_{BEQ5\ or\ Q6}$ is approximately 1 volt. Moreover, when the transistor Q4 operates in the reverse conduction mode, the value $V_{CEQ4}$ may approach $-1$ volt. Under this condition, then, the value $V_{CEQ5\ or\ Q6}$ may approach zero, resulting in destruction of one or both of these transistors.

As previously mentioned, the circuit shown in FIG. 4 encounters this difficulty only when relatively light loads are being driven by the switch S1. The circuit otherwise performs satisfactorily and hence is appropriate for those applications where light loads will not be driven.

Figure 6:
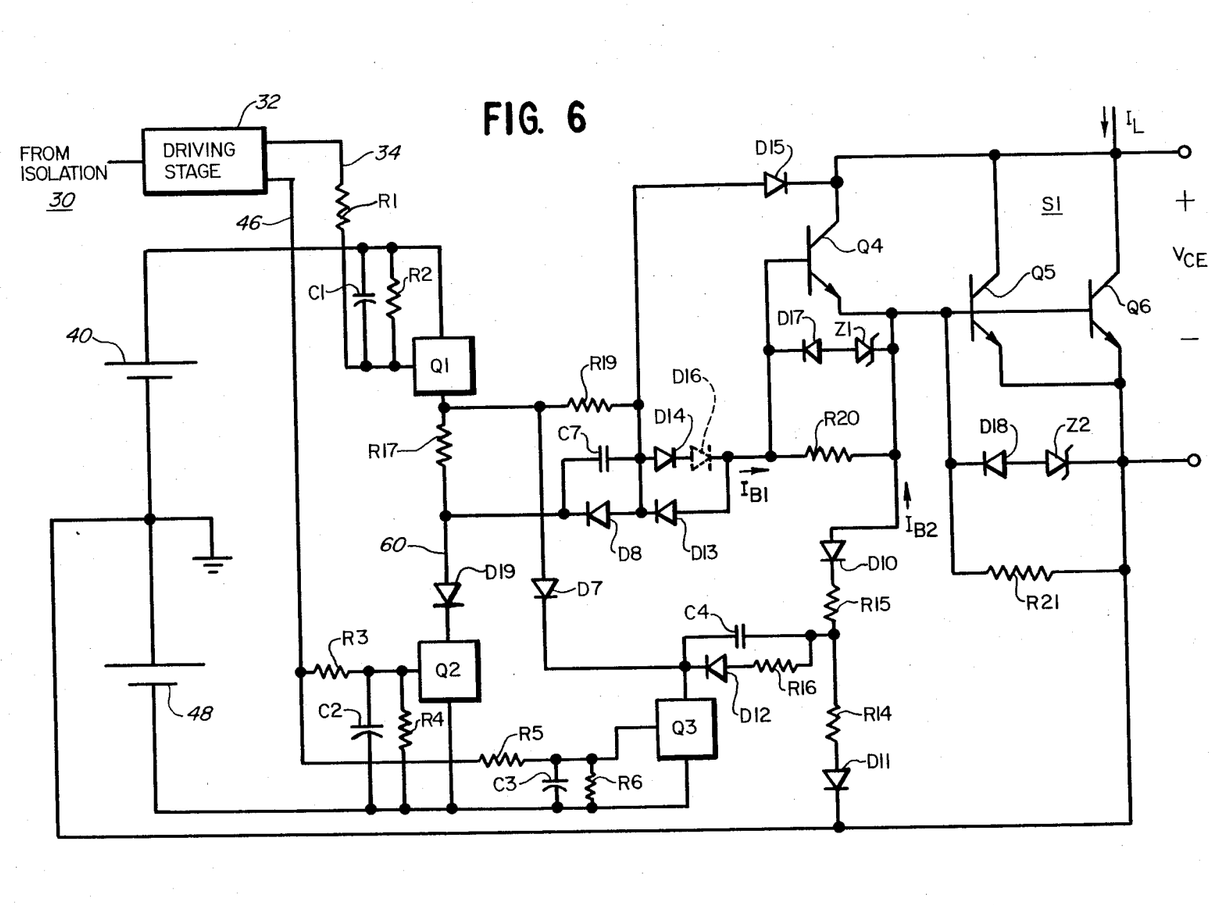
FIG. 6 is a diagram similar to that of FIG. 4 illustrating an alternative embodiment of the invention.

Referring now to FIG. 6, there is illustrated an alternative embodiment of the present invention which is capable of driving all types of loads, including light loads, without rates of destruction of the transistors Q4-Q6. Elements common to the embodiments shown in FIGS. 4 and 6 are assigned like reference numerals. The operation of the embodiment of FIG. 6 is illustrated in the broken line waveforms of FIG. 5.

As was noted with respect to the embodiment shown in FIG. 4, each of the ransistors Q1, Q2 and Q3 is operated so that a dwell interval or delay period is interposed between turn off of the transistor Q1 and turn on of the transistors Q2 and Q3. In this case, however, the values of one or more of the resistors R3, R4 and the capacitor C2 are changed so that the transistor Q2 turns on within a short time period following turn-off of the transistor Q1, e.g. 50 nanoseconds. (This dwell interval between turn-off of the transistor Q1 and turn-on of the transistor Q2 is so short as to appear nonexistent in the figure.) It is possible to turn on the transistor Q2 after such a short interval following turn-off of the transistor Q1 due to the small amount of charge carriers in the base-collector junction of the transistor Q4 in the embodiment shown in FIG. 6, as noted more specifically below.

Further, as is the case in the embodiment of FIG. 4, the diode D7 and the capacitor C4 are provided so that a voltage is built up across the capacitor C4 when the transistors Q1 and Q4-Q6 are on. However, a diode D10 is provided to prevent current flow in a direction which causes the driver transistor Q4 to operate in the reverse conduction mode. Instead, charging current for the capacitor C4 flows through a resistor R14 and a diode D11 to ground. Then, following the dwell interval after turn off of the transistor Q1 and turn-on of the transistors Q2 and Q3, reverse base drive current flows through the diode D10, a resistor R15, the capacitor C4 and the transistor Q3 to the second power source 48. The capacitor C4, as noted with respect to the previous embodiment shown in FIG. 4, therefore supplies the augmented voltage of the second polarity across the base and emitter junctions of the transistors Q5 and Q6 to quickly turn off same.

It should be noted that a resistor R16 and diode D12 are coupled across the capacitor C4 to maintain the reverse bias voltage across the base-emitter junctions of the transistors Q5,Q6 for the entire turn-off period. This, in turn, increases the immunity of the transistors against inadvertent turn-on in response to large changes of collector to emitter voltage during this period.

Means are also provided for operating the transistor Q4 substantially at or slightly below the edge of saturation to further minimize the possibility of operation in the reverse conduction mode. Such means comprises a circuit known as a "Baker clamp" comprising diodes D13, D14 and D15 which bias the base-collector junction of the transistor Q4 so that the transistor operates, when on, in the quasi-saturation or desaturation mode. In effect, the value $V_{CESAT}$ of the transistor Q4 is slightly increased to minimize the possibility of operation in the reverse conduction mode. By adding an additional diode D16, shown in dotted lines in FIG. 6, one can further reduce the probability of operation in the reverse saturation mode of the transistor Q4. In effect, this diode will cause $V_{CESAT}$ of the transistor Q4 to further increase to cause operation at a point further below the edge of saturation.

While the Baker clamp increases the power dissipation of the circuit, it is felt that this disadvantage is outweighed by the protection afforded against destruction of the expensive power transistors Q5 and Q6.

The Baker clamp also reduces the amount of charge carriers in the base collector junction of the transistor Q4, when on. This minimizes the incidence of secondary breakdown effects and permits the transistor Q2 to be turned on relatively quickly following turn-off of the transistor Q1. In fact, as seen in FIG. 5, maximum reverse base current $I_{B1}$ occurs at time $t=t_6$ while the maximum reverse bas current $I_{B2}$ is reached at a time $t=t_7$ both of which are well prior to the time $t=t_5$ noted with respect to the embodiment of FIG. 4. The switch S1 is thereby turned off even more quickly than the embodiment of FIG. 4 while at the same time secondary breakdown effects are lessened.

There are additional differences in the circuit of FIG. 6 over that shown in FIG. 4. The capacitors C5 and C6 are replaced by a capacitor C7 which is coupled across the diode D8. The capacitor C7 accomplishes the same function of the capacitors C5 and C6, i.e. to provide an augmented reverse bias voltage across the transistor Q4 to quickly turn off same. The resistor R12, shown in FIG. 4, is omitted in the circuit of FIG. 6. In addition, a resistor R17 is coupled in series between the switches Q1 and Q2 to limit the destructive effects of shoot-through and a resistor R19 is coupled between the switch Q1 and the diode D14 which functions as a current limiter.

Also, appropriate biasing circuitry comprising diodes D17 and D18, zener diodes Z1 and Z2 and resistors R20 and R21 limit the reverse bias across the base-emitter junctions of the transistors Q4-Q6. Corresponding circuitry is also included in FIG. 4 but is not shown therein for simplicity.

A diode D19 is provided between the capacitor C7 and the transistor Q2. This diode prevents current flow in a direction which would tend to spuriously turn on the transistor Q4, which current may be a result of the combined inductance of the leads of the circuit and the capacitance of the capacitor C7. This diode D19 also isolates the transistor Q2 to prevent unwanted reverse current flow in the event this transistor comprises a MOSFET.

The embodiment shown in FIG. 6 is effective to rapidly switch the transistors Q4-Q6 between on and off states while at the same time preventing reverse conduction of the transistor Q4 which may cause short circuiting of the transistors Q5 and Q6.

It should be noted that the circuits shown in FIGS. 4 and 6 can be modified by eliminating the transistor Q2, the resistors R3 and R4, the capacitor C2 and the diode D19 at the expense of a small increase in the turn-off time of the switch S1 and slightly higher risk of secondary breakdown of the switch S1.

In this case, the control or base electrode of the driver transistor Q4 is coupled to a main current path electrode of the transistor Q3 through the diodes D8 and D7 and the resistors R13 and R7 (FIG. 4) or through the diode D13, the capacitor C7, the resistor R17 and the diode D7 (FIG. 6). Thus, when the transistor Q3 is turned on, reverse base drive is applied to the transistors Q4–Q6 to quickly turn off same.

We claim:

1. A drive circuit for rapidly switching transistors each having a control electrode and a pair of main current electrodes and connected in a Darlington configuration whereby the control electrode of a driven transistor is coupled to one of the main current electrodes of a driver transistor and the other of the main current electrodes of the driver transistor is coupled to one of the main current electrodes of the driven transistor, comprising:

a first power source developing voltage of a first polarity;

a turn-on gating network coupled between the first power source and the control electrode of the driver transistor for selectively applying the first polarity voltage to the transistors to turn on same;

a second power source developing voltage of a second polarity opposite the first polarity;

a turn-off gating network coupled between the second power source and the transistors for selectively applying the second polarity voltage to the transistors to turn off same; and first and second turn-off capacitors coupled between the gating networks and the control electrodes of the driven and driver transistors, respectively, for providing an augmented voltage of the second polarity greater than the voltage developed by the second power source to the transistors for quickly turning off same.

2. The drive circuit of claim 1, wherein the turn-on gating network and the turn-off gating network are responsive to a gating signal which assumes one of two states whereby the transistors are on when the gating signal is in a first state and are off when the gating signal is in a second state and wherein the turn-off gating network includes means for delaying application of the second polarity voltage to the transistors for a delay period following a transition of the gating signal from the first to the second states to allow recombination of excess carriers in the transistors.

3. The drive circuit of claim 2, wherein the turn-off gating network includes first and second turn-off transistors each having a control and main current path electrodes wherein the control electrodes of the driver and driven transistors are coupled to a main current path electrode of the first and second turn-off transistors, respectively, and the control electrodes of the first and second turn-off transistors receive the gating signal.

4. The drive circuit of claim 1 wherein the turn-off gating network includes separate first and second means for applying the second polarity voltage to the driver and driven transistors, respectively.

5. The drive circuit of claim 4, wherein each of the first and second applying means comprises a transistor controlled by a gating signal.

6. The drive circuit of claim 1, further including a diode coupled between the first capacitor and the control electrode of the driven transistor for preventing current flow in a direction which causes the driver transistor to operate in a reverse conduction mode when such transistor is on.

7. The drive circuit of claim 1, further including means for operating the driver transistor at substantially the edge of saturation when the first polarity voltage is applied to the transistors.

8. The drive circuit of claim 7, wherein the operating means comprises a first diode coupled between the turn-on gating network and the control electrode of the driver transistor and a second diode coupled between the control electrode and the other of the main current electrodes of the driver transistor.

9. A base drive circuit for rapidly switching a driver and a driven transistor connected together in a Darlington configuration, each transistor including a base electrode and collector and emitter electrodes, comprising:

a first power source developing voltage of a first polarity;

a turn-on gating network coupled to the base electrode of the driver transistor for selectively applying the first polarity voltage to the transistor to turn on same;

a pair of turn-off capacitors each coupled between the turn-on gating network and the base of one of the driven transistors;

a second power source developing voltage of a second polarity opposite the first polarity; and a turn-off gating network including a first switch coupled between the turn-off capacitor coupled to the base of the driver transistor and the second power source and a second switch coupled between the turn-off capacitor coupled to the base of the driven transistor and the second power source whereby the first and second switches are selectively simultaneously closed to apply augmented voltages of the second polarity greater than the voltage developed by the second power source to the base of the driver and driven transistors to thereby rapidly turn off same.

10. The base drive circuit of claim 9, wherein the first polarity voltage and the second polarity voltage are alternately applied to the transistors and further including means for providing a dwell interval between application of the first polarity voltage and application of the second polarity voltage to the transistors during which neither voltage is applied thereto to allow recombination of excess carriers in the transistors.

11. The base drive circuit of claim 10, wherein in the first and second switches in the turn-off gating network comprise first and second turn-off transistors, respectively, each having a control electrode and wherein the providing means comprises first and second delay capacitors coupled to the control electrodes of the first and second turn-off transistors, respectively.

12. The base drive circuit of claim 11, further including a diode coupled between one of the turn-off capacitors and the emitter of the driver transistor for preventing current flow in a direction which causes the driver transistor to operate in a reverse-conduction mode.

13. The drive circuit of claim 9, further including means for operating the driver transistor at the edge of saturation when the first polarity voltage is applied to the transistors.

14. The base drive circuit of claim 13, wherein in the operating means comprises a first diode coupled between the turn-on gating network and the base electrode of the driver transistor and a second diode coupled between the base electrode and the collector electrode of the driver transistor.

15. A base drive circuit for rapidly switching a driver and a driven transistor connected together in a Darlington configuration, each transistor including a base electrode and collector and emitter electrodes, comprising:

means for alternately applying forward and reverse base drive to the transistors to turn the transistors on and off, wherein the applying means comprises a turn-on gating network coupled to the base electrode of the driver transistor and a turn-off gating network coupled to the bases of both transistors; and means for providing a dwell interval between application of the forward and reverse base drive during which no drive is applied to the transistors to allow recombination of excess carriers therein.

16. The base drive circuit of claim 15, wherein the turn-on gating network and the turn-off gating network are responsive to a gating signal which assumes one of two states whereby the driver and driven transistors are on when the gating signal is in a first state and are off when the gating signal is in a second state and wherein the providing means comprises means for delaying application of the reverse base drive to the transistors for a delay period following a transition of the gating signal from the first to the second states.

17. The base drive circuit of claim 16, wherein the turn-off gating network includes first and second turn-off transistors each having a control and main current path electrodes wherein the base electrodes of the driver and driven transistors are coupled to a main current path electrode of the first and second turn-off transistors, respectively, and the control electrodes of the first and second turn-off transistors receive the gating signal.

18. The base drive circuit of claim 17, wherein the delaying means comprises first and second capacitors coupled to the control electrodes of the first and second turn-off transistors, respectively.

19. The base drive circuit of claim 15, further including first and second turn-off capacitors coupled between a junction between the turn-off network and the turn-off network and the base of the driven and driver transistors, respectively, for quickly turning off the transistors.

20. The base drive circuit of claim 19, further including a diode coupled between the first turn-off capacitor and the emitter of the driver transistor to prevent current flow in a direction which causes reverse conduction of the driver transistor.

21. A base drive circuit for rapidly switching a driver and a driven transistor connected together in a Darlington configuration, each transistor including a base electrode and collector and emitter electrodes, comprising:

a turn-on network coupled to the driver transistor for selectively turning on same;

a turn-off network coupled to the turn-on network and to the transistors for selectively turning off same; and means coupled between the turn-on network and the driver transistor for preventing operation of the driver transistor in the reverse saturation mode.

22. The base drive circuit of claim 21 wherein the preventing means comprises a diode coupled between the emitter of the driver transistor and the turn-on network for preventing current flow into such emitter.

23. The drive circuit of 3, wherein the delaying means includes means for turning on the first turn-off transistor a first period of time following a transistion of the gating signal from the first to the second state and means for turning on the second turn-off transistor a second period of time longer than the first period of time following the transition of the gating signal from the first to the second states.

24. The drive circuit of claim 3, wherein a capacitor and a diode are connected by leads between a main current path electrode of the first turn-off transistor and a control electrode of the driver transistor wherein the diode is poled to block currents which would cause spurious energization of the driver transistor due to the inductance of the leads and the capacitance of the capacitor.

25. The drive circuit of claim 2, wherein the turn-off gating network includes a turn-off transistor having a control and main current path electrodes wherein the control electrodes of the driver and driven transistors all coupled to a main current path electrode of the turn-off transistor and the control electrode of the turn-off transistor receives the gating signal.

* * * * *